(12) United States Patent
Cuellar et al.

(10) Patent No.: US 7,364,090 B2
(45) Date of Patent: *Apr. 29, 2008

(54) MEMORY CARDS HAVING TWO STANDARD SETS OF CONTACTS

(75) Inventors: Edwin J. Cuellar, San Jose, CA (US); Eliyahou Harari, Saratoga, CA (US); Robert C. Miller, San Jose, CA (US); Hem P. Takiar, Fremont, CA (US); Robert F. Wallace, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/536,974

(22) Filed: Sep. 29, 2006

(65) Prior Publication Data

US 2007/0032101 A1    Feb. 8, 2007

Related U.S. Application Data

(63) Continuation of application No. 10/826,801, filed on Apr. 16, 2004, now Pat. No. 7,152,801.

(51) Int. Cl.
*G06K 19/06* (2006.01)
(52) U.S. Cl. ..................................... 235/492
(58) Field of Classification Search ............ 235/492
See application file for complete search history.

(56) References Cited

U.S. PATENT DOCUMENTS

| 4,555,619 A | 11/1985 | Anderson |
| 5,155,663 A | 10/1992 | Harase |
| 5,457,601 A | 10/1995 | Georgopulos et al. |
| 5,486,687 A | 1/1996 | Le Roux |
| 5,752,857 A | 5/1998 | Knights |
| 5,815,426 A | 9/1998 | Jigour et al. |
| 5,887,145 A | 3/1999 | Harari et al. |
| 5,969,333 A | 10/1999 | Barthelemy et al. |

(Continued)

FOREIGN PATENT DOCUMENTS

DE    20304040U1 A    8/2003

(Continued)

OTHER PUBLICATIONS

"PC Card Standard Release 8.0", Personal Computer Memory Card International Association (PCMCIA), Apr. 2001, vol. 1, pp. iii-34 and vol. 3, pp. iii-70.

(Continued)

*Primary Examiner*—Michael G. Lee
*Assistant Examiner*—Tae W. Kim
(74) *Attorney, Agent, or Firm*—Davis Wright Tremaine LLP

(57) ABSTRACT

Enclosed re-programmable non-volatile memory cards include at least two sets of electrical contacts to which the internal memory is connected. The two sets of contacts have different patterns, preferably in accordance with two different contact standards such as a memory card standard and that of the Universal Serial Bus (USB). One memory card standard that can be followed is that of the Secure Digital (SD) card. The cards can thus be used with different hosts that are compatible with one set of contacts but not the other. A sleeve that is moveable by hand may be included to expose the set of contacts being used.

16 Claims, 8 Drawing Sheets

U.S. PATENT DOCUMENTS

| | | | |
|---|---|---|---|
| 5,984,708 | A | 11/1999 | Yu |
| 6,040,622 | A | 3/2000 | Wallace |
| 6,069,795 | A | 5/2000 | Klatt et al. |
| 6,097,605 | A | 8/2000 | Klatt et al. |
| 6,121,681 | A | 9/2000 | Tanaka et al. |
| 6,137,710 | A | 10/2000 | Iwasaki et al. |
| 6,151,652 | A | 11/2000 | Kondo et al. |
| 6,181,564 | B1 | 1/2001 | Furusho |
| 6,243,686 | B1 | 6/2001 | McPherson et al. |
| D444,473 | S | 7/2001 | Okamoto et al. |
| D445,111 | S | 7/2001 | Okamoto et al. |
| 6,256,692 | B1 | 7/2001 | Yoda et al. |
| 6,266,724 | B1 | 7/2001 | Harari et al. |
| D446,525 | S | 8/2001 | Okamoto et al. |
| 6,279,114 | B1 | 8/2001 | Toombs et al. |
| 6,295,206 | B1 | 9/2001 | Kondo et al. |
| 6,325,291 | B1 | 12/2001 | Eisele et al. |
| 6,330,151 | B1 | 12/2001 | Bates, III |
| 6,341,728 | B1 | 1/2002 | Kondo et al. |
| 6,353,870 | B1* | 3/2002 | Mills et al. ............. 710/301 |
| 6,381,143 | B1 | 4/2002 | Nakamura |
| 6,385,677 | B1 | 5/2002 | Yao et al. |
| 6,422,469 | B1 | 7/2002 | Pernet |
| 6,435,409 | B1 | 8/2002 | Hu |
| 6,438,638 | B1 | 8/2002 | Jones et al. |
| 6,439,464 | B1 | 8/2002 | Fruhauf et al. |
| 6,483,038 | B2 | 11/2002 | Lee et al. |
| 6,518,927 | B2 | 2/2003 | Schremmer et al. |
| 6,524,137 | B1 | 2/2003 | Liu et al. |
| 6,561,421 | B1 | 5/2003 | Yu |
| 6,567,273 | B1 | 5/2003 | Liu et al. |
| 6,580,615 | B1 | 6/2003 | Nakanishi et al. |
| 6,590,615 | B2 | 7/2003 | Murakami et al. |
| 6,594,154 | B1 | 7/2003 | Brewer et al. |
| 6,612,498 | B1 | 9/2003 | Lipponen et al. |
| 6,617,673 | B2 | 9/2003 | Lee et al. |
| 6,623,304 | B2 | 9/2003 | Harasawa et al. |
| 6,632,097 | B2 | 10/2003 | Chang |
| 6,646,885 | B1 | 11/2003 | Yu et al. |
| 6,669,487 | B1 | 12/2003 | Nishizawa et al. |
| 6,676,420 | B1 | 1/2004 | Liu et al. |
| 6,733,340 | B2 | 5/2004 | Nishio et al. |
| 6,738,259 | B2 | 5/2004 | Le et al. |
| 6,763,410 | B2 | 7/2004 | Yu |
| 6,820,148 | B1 | 11/2004 | Cedar et al. |
| 6,890,188 | B1* | 5/2005 | Le ............. 439/76.1 |
| 6,901,457 | B1 | 5/2005 | Toombs et al. |
| 6,908,038 | B1* | 6/2005 | Le ............. 235/492 |
| 7,062,585 | B2 | 6/2006 | Chen |
| 7,104,809 | B1 | 9/2006 | Huang |
| 7,152,801 | B2 | 12/2006 | Cuellar et al. |
| 2001/0009505 | A1 | 7/2001 | Nishizawa et al. |
| 2003/0100203 | A1 | 5/2003 | Yen |
| 2003/0212848 | A1 | 11/2003 | Liu et al. |
| 2003/0233507 | A1 | 12/2003 | Yu et al. |
| 2004/0033726 | A1 | 2/2004 | Kao |
| 2004/0033727 | A1 | 2/2004 | Kao |
| 2004/0039854 | A1 | 2/2004 | Estakhri et al. |
| 2004/0042323 | A1* | 3/2004 | Moshayedi ............. 365/232 |
| 2004/0089717 | A1 | 5/2004 | Harari et al. |
| 2005/0037647 | A1* | 2/2005 | Le ............. 439/131 |
| 2005/0037671 | A1* | 2/2005 | Yamada et al. ............. 439/677 |
| 2005/0230483 | A1 | 10/2005 | Miller et al. |
| 2005/0230484 | A1 | 10/2005 | Cuellar et al. |
| 2006/0084287 | A1 | 4/2006 | Miller et al. |

FOREIGN PATENT DOCUMENTS

| | | |
|---|---|---|
| DE | 20311679 U1 | 11/2003 |
| EP | 0891047 | 1/1999 |
| EP | 1085516 | 3/2001 |
| EP | 1 146 428 A1 | 10/2001 |
| EP | 1 333 531 A1 | 8/2003 |
| JP | 2001-307801 | 2/2001 |
| WO | WO 00/70553 | 11/2000 |
| WO | WO0184490 | 8/2001 |
| WO | 02/13021 A3 | 2/2002 |
| WO | WO 02/15020 | 2/2002 |
| WO | WO 02/19266 | 3/2002 |
| WO | WO 2005/086011 A1 | 9/2005 |

OTHER PUBLICATIONS

SanDisk Corporation, "CompactFlash Memory Card Product Manual," revision 10.1, Sep. 2003, 97 pages.

MMCA Technical Committee, "The MultiMedia Card System Specification," Version 3.1, Jun. 2001, 130 pages.

SanDisk Corporation, SanDisk Standard Grade, CompactFlash and PC Card, Product Manual, Version 1.4, Dec. 2003, 104 pages.

"Information Technology—Identification Cards—Integrated Circuit(s) Cards With Contacts, Part 2: Dimensions and Location of the Contacts", ISO/IEC 7816-2, Mar 1, 1999, 10 pages.

"Information Technology—Identification Cards—Integrated Circuit(s) Cards With Contact, Part 3: Electronic Signals and Transmission Protocols", ISO/IEC 7816-3, 2nd Edition, Dec. 15, 1997, 32 pages.

"Information Technology—Identification Cards—Integrated Circuit(s) Cards With Contact, Part 3: Electronic Signals and Transmission Protocols, Amendment 1: Electrical Characteristics and Class Indication for Integrated Circuit(s) Cards Operating at 5 V, 3 V and 1,8 V", ISO/IEC 7816-3, Jun. 1, 2002, 10 pages.

Compaq et al., "Universal Serial Bus Specification", revision 2.0, Apr. 27, 2000, pp. i-xxvii, 1-24 and 85-117.

"IEEE Standard for a High Performance Serial Bus", document no. IEEE 1394-1995, pp. 1-81, 259-260, 336-341, as amended by document Nos. IEEE 1394a-2000 pp. 1-2 and 24, and IEEE 1394b-2002, pp. 1-2, 35-75.

"SanDisk Launches Cruzer USB Flash Drives and Cruzer Micro MP3 Companion Player in China, Taiwan and Hong Kong", http://www.sandisk.com/pressrelease/20040407.html, Apr. 9, 2004, 4 pages.

"SanDisk Cruzer USB Flash Drives", http://www.sandisk.com/pdf/retail/Cruzer_Family_Brochure_English.pdf, Jan. 20, 2004, 2 pages.

"USB Flash Drive", http://www.pqimemory.com/products-istick.asp, downloaded Sep. 7, 2004, 2 pages.

Hughes, Judie, "Gadgeteer Hands on Review: Intelligent Stick USB Drive", Nov. 6, 2003, http://pqi1st.com/reviews/review020404.asp, 3 pages.

CompactFlash Association, "CF+ and CompactFlash Specification," Revision 2.0, May 2003, 137 pages.

"What is Memory Stick", http://www.memorystick.org/eng/aboutms/family.html, downloaded Mar. 12, 2004, 4 pages.

GSM Global System for Mobile Communication, "Digital Cellular Telecommunications System (Phase 2+); Specification of the Subscriber Identity Module—Mobile Equipment (SIM—ME) Interface," GSM 11.11 Version 8.3.0 Release 1999, 170 pages.

SD Group, "Simplified Version of Part 1: Physical Layer Specification", Version 1.01, Apr. 15, 2001, 32 pages.

SanDisk Corporation, "SanDisk miniSD Card Product Manual", Version 1.0, Apr. 2003, 110 pages.

SanDisk Corporation, "MultiMediaCard Product Manual," Revision 5.2, Mar. 2003, 100 pages.

"Identification cards—Physical characteristics", International Organization for Standardization (ISO) and the International Electrotechnical Commission (IEC), ISO/IEC 7810 standard, second edition, Aug. 15, 1995. 9 pages.

"Identification Cards—Integrated Circuit(s) Cards With Contact, Part I: Physical Characteristics", ISO/IEC 7816-1, Oct. 15, 1998, 8 pages.

"Identification Cards—Integrated Circuit(s) Cards With Contact, Part 1: Physical Characteristics, Amendment 1: Maximum Height of the IC Contact Surface", ISO/IEC 7816-1, Nov. 15, 2003, 7 pages.

SD Group, "SD Memory Card Simplified Specifications, Part 1, Physical Layer Specification", Version 0.96, Jan. 2000, 28 pages.

EPO/ISA, "Notification of Transmittal of the International Search Report and the Written Opinion of the International Searching Authority, or the Declaration", mailed in related PCT/US2005/012901 on Sep. 7, 2005, 8 pages.

EPO/ISA, "Notification of Transmittal of the International Search Report and the Written Opinion of the International Searching Authority, or the Declaration", mailed in related PCT/US2005/012695 on Sep. 20, 2005, 9 pages.

EPO, "Office Action," mailed in related European Patent Application No. 05 738 716.9 on Sep. 14, 2007, 2 pages.

* cited by examiner

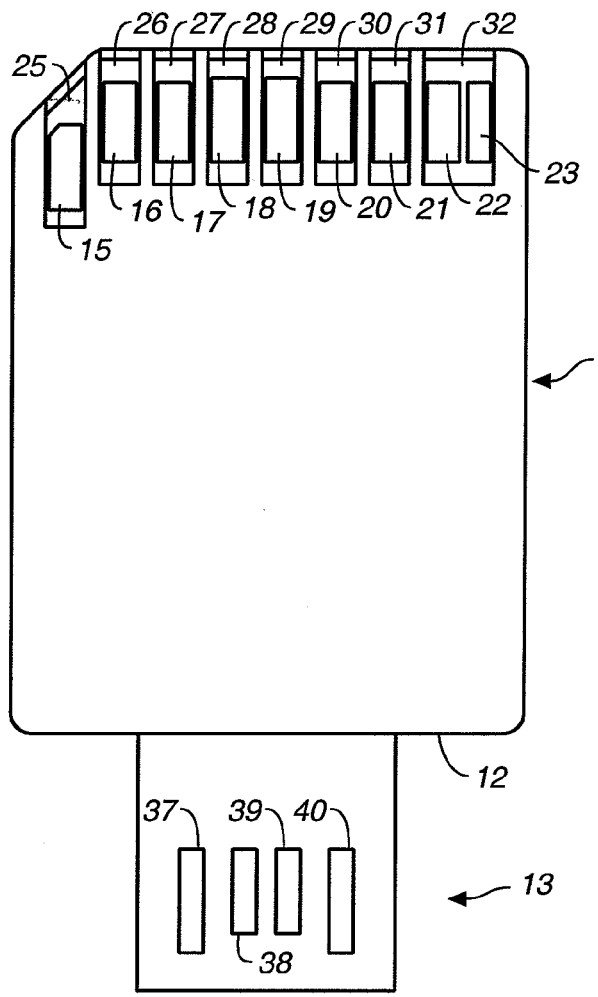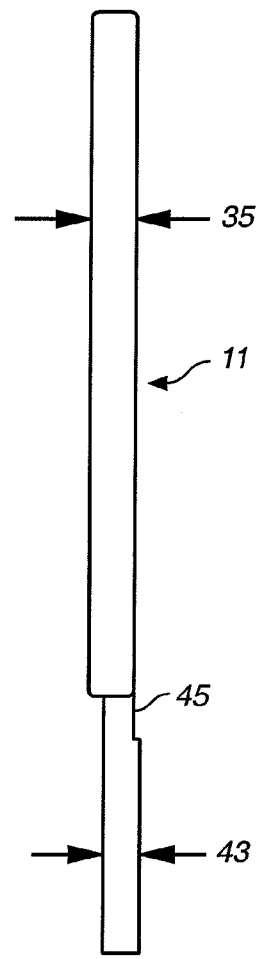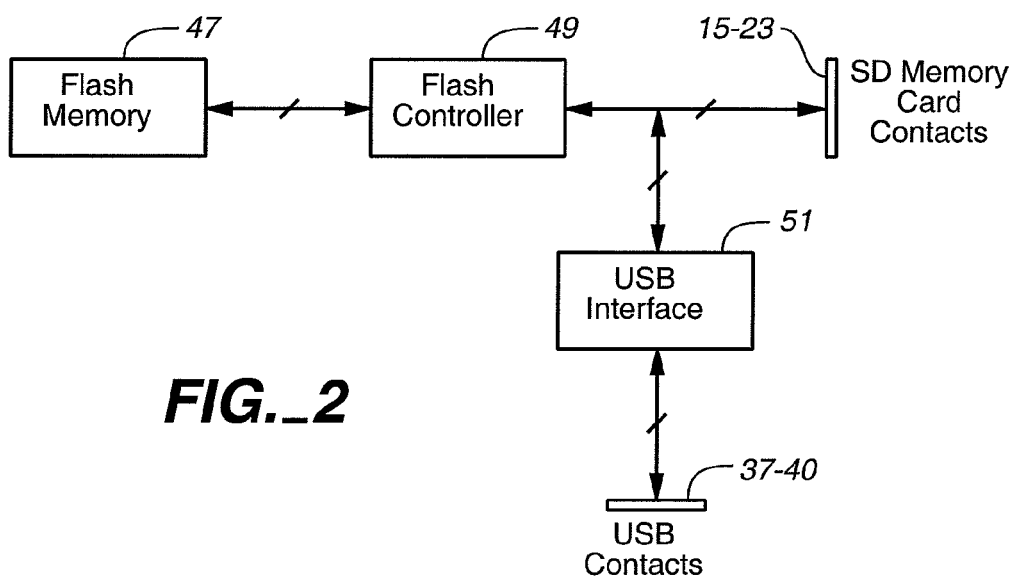
FIG._1A
FIG._1B
FIG._2

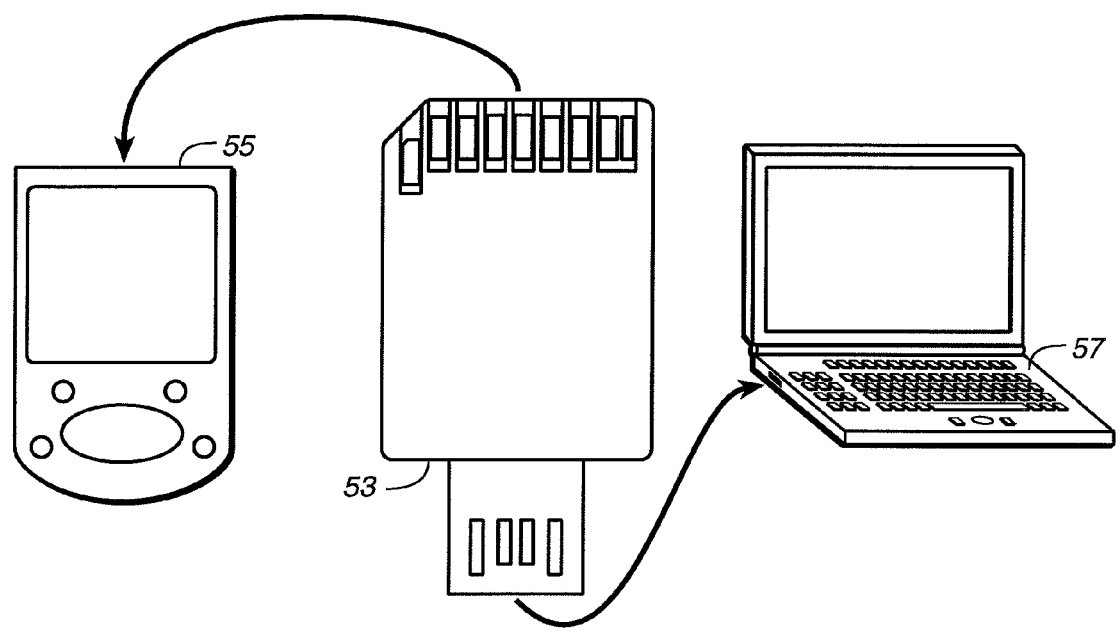
FIG._3
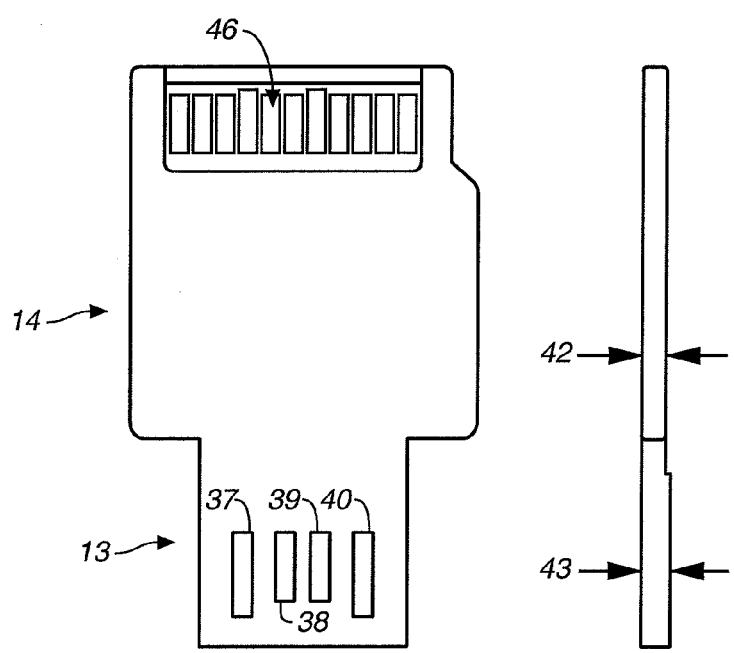
FIG._4A   FIG._4B

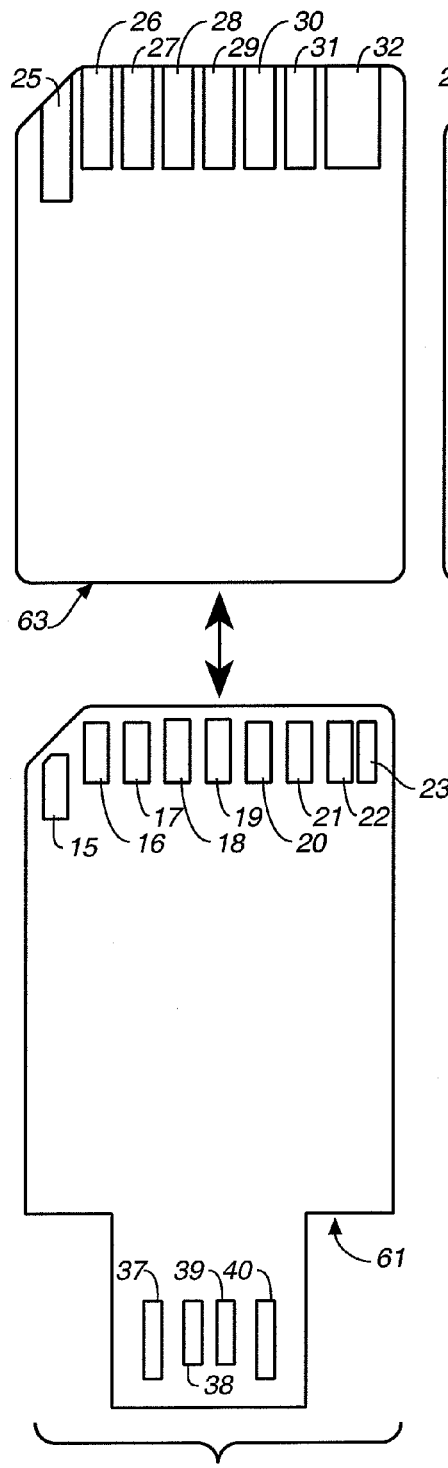
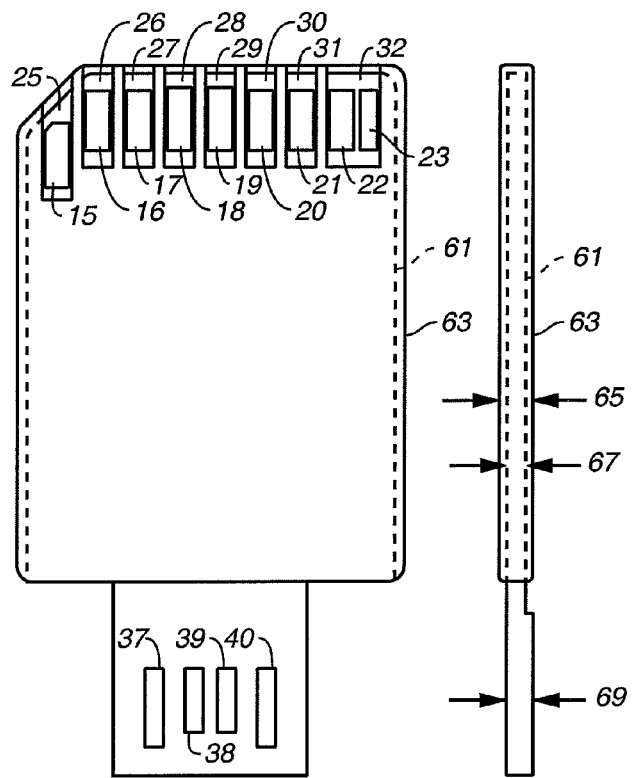
FIG._5A
FIG._5B  FIG._5C

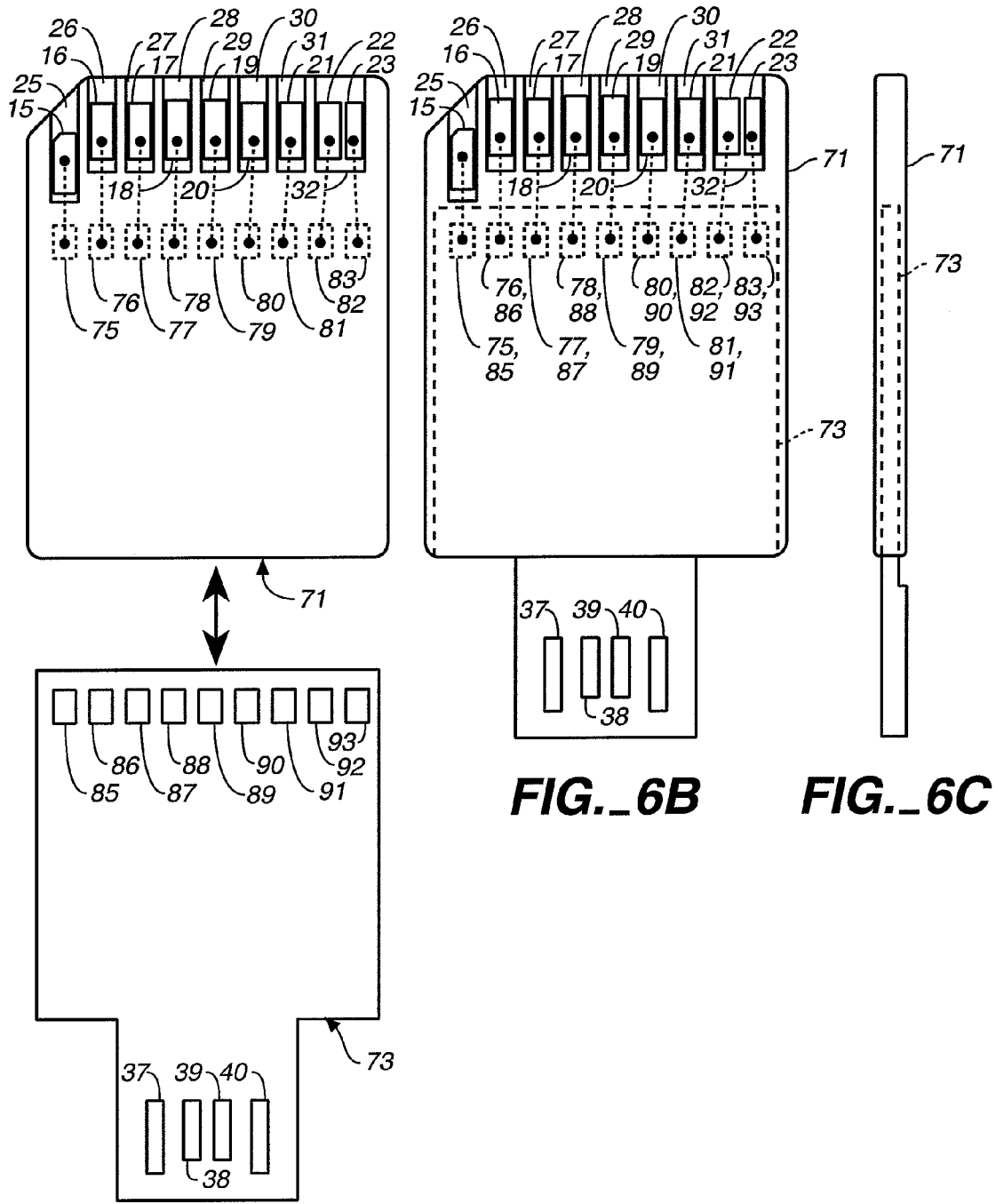
FIG._6A   FIG._6B   FIG._6C

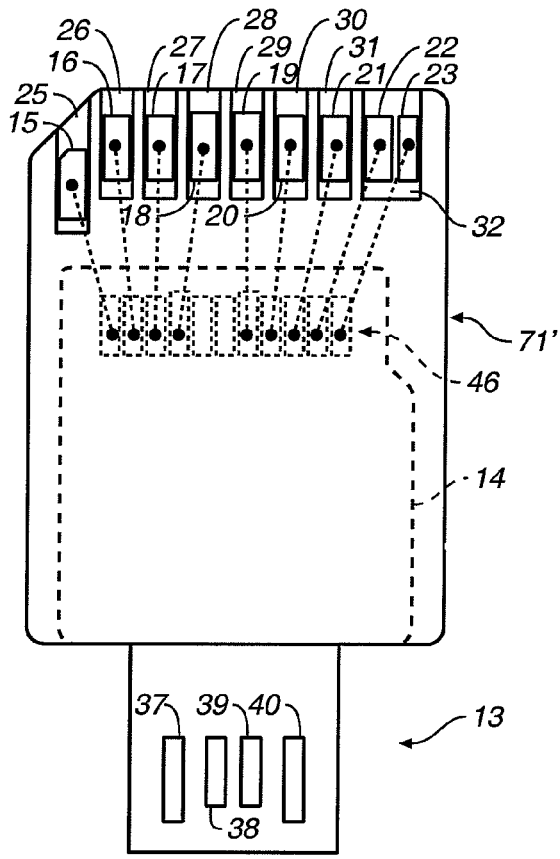
FIG._7
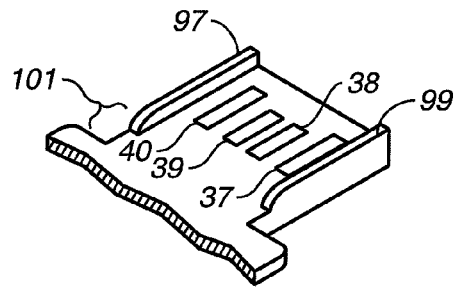
FIG._8
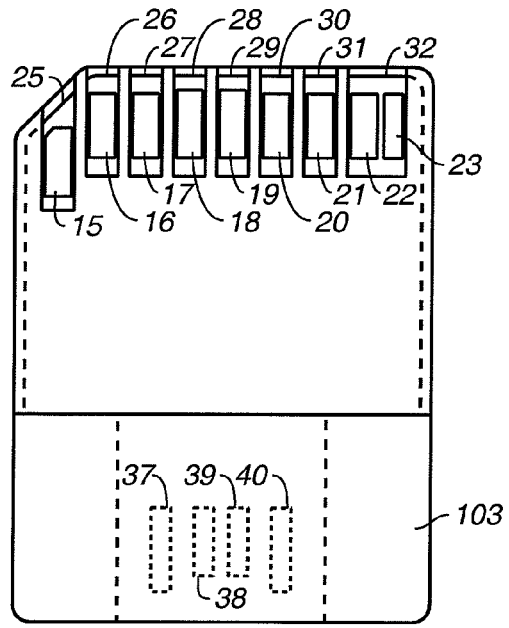
FIG._9A
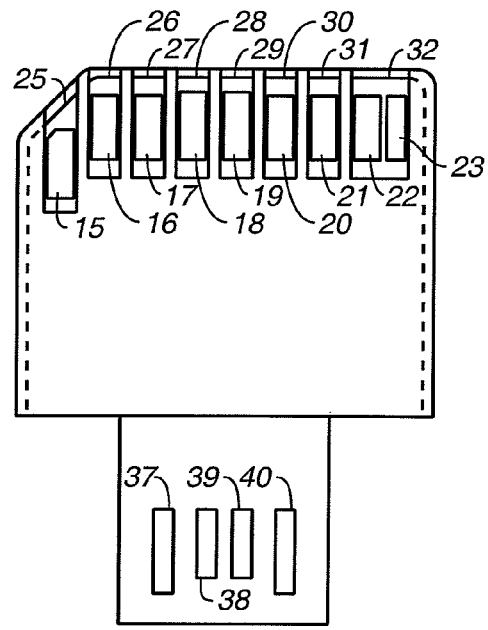
FIG._9B

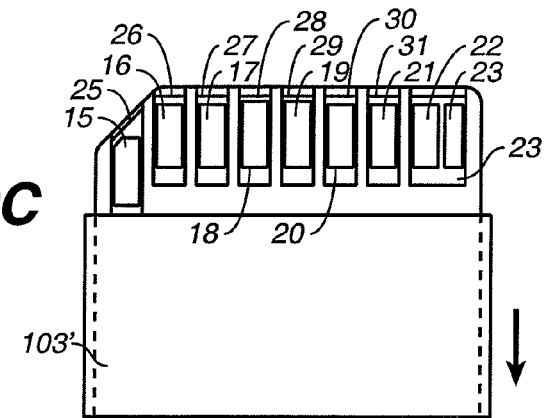
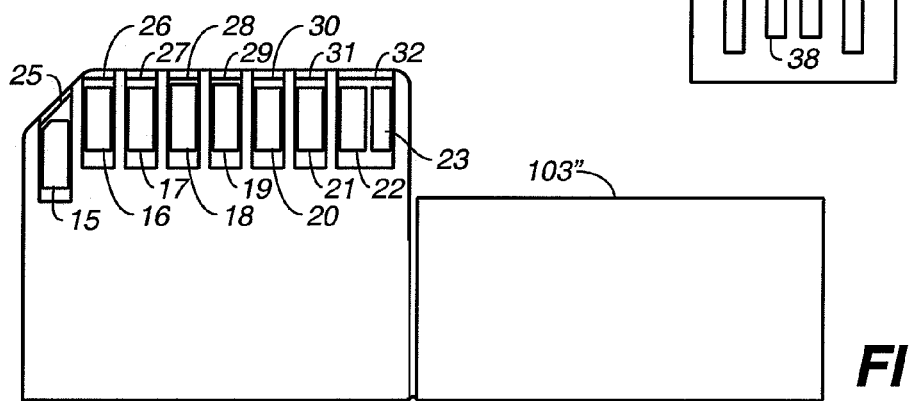
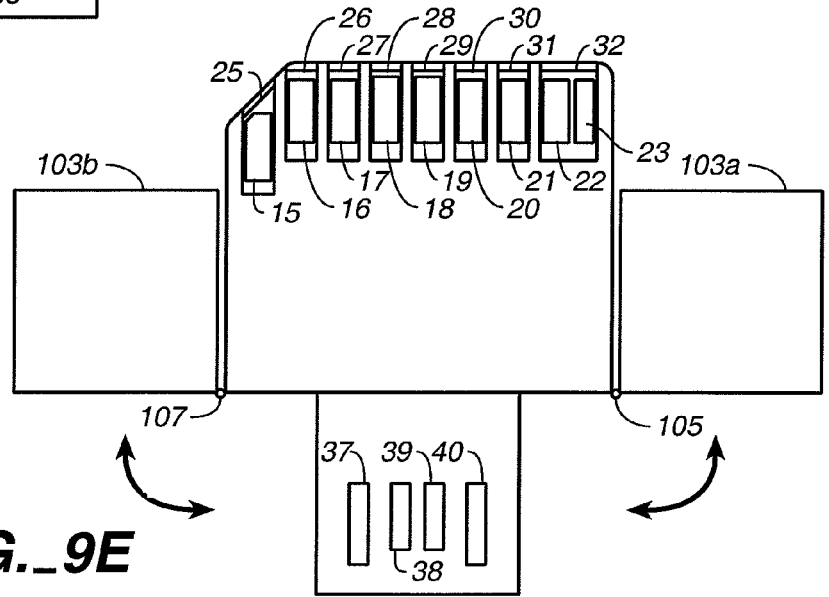

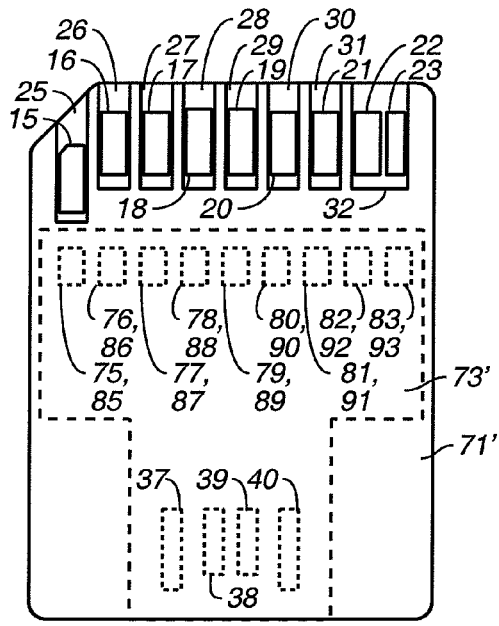
FIG._10A
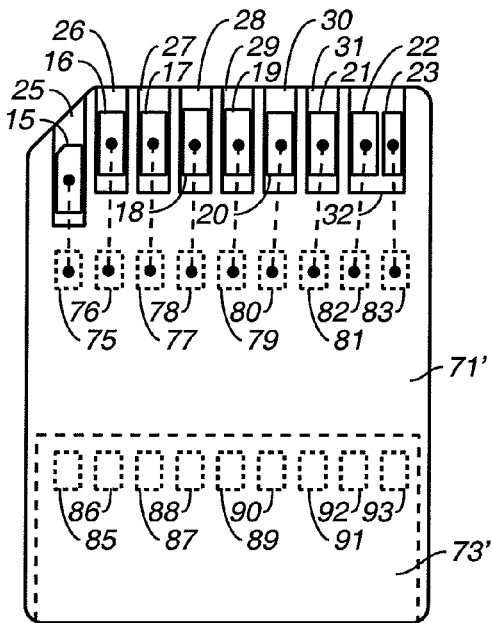
FIG._10B
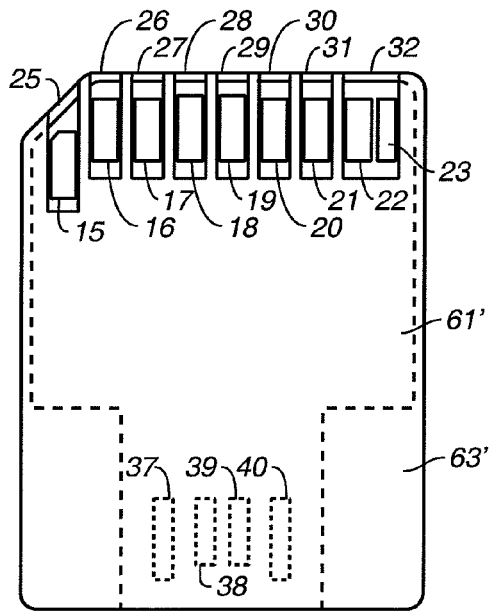
FIG._11A
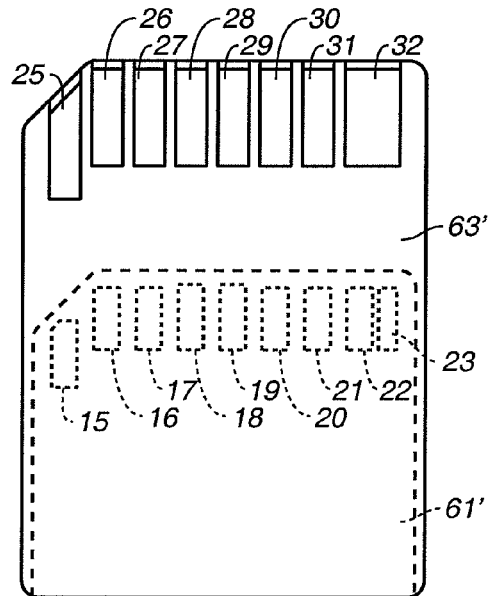
FIG._11B

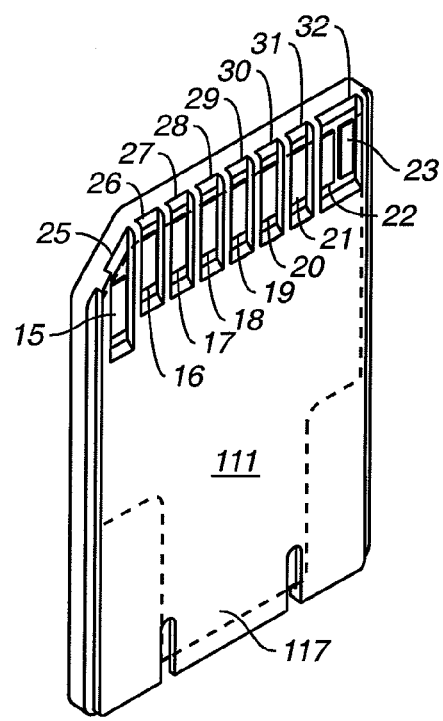
FIG._12A
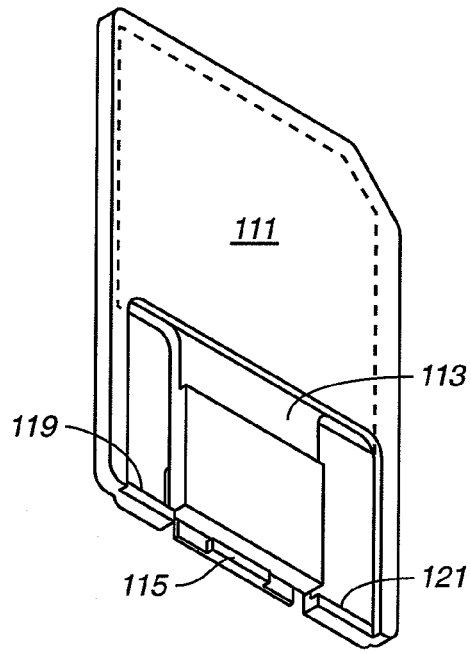
FIG._12B
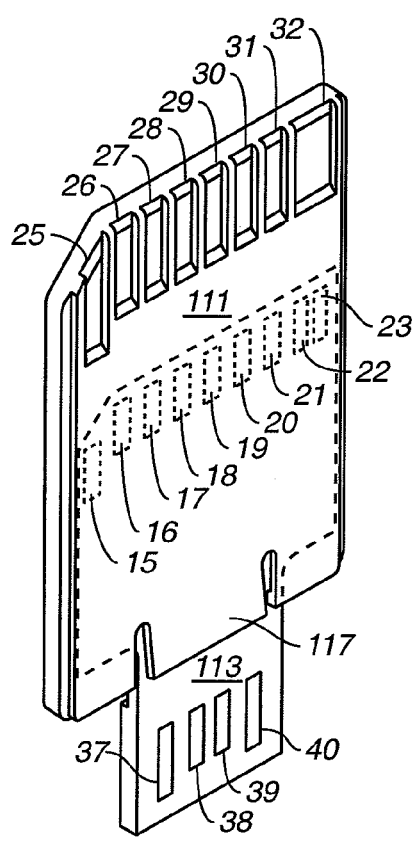
FIG._12C
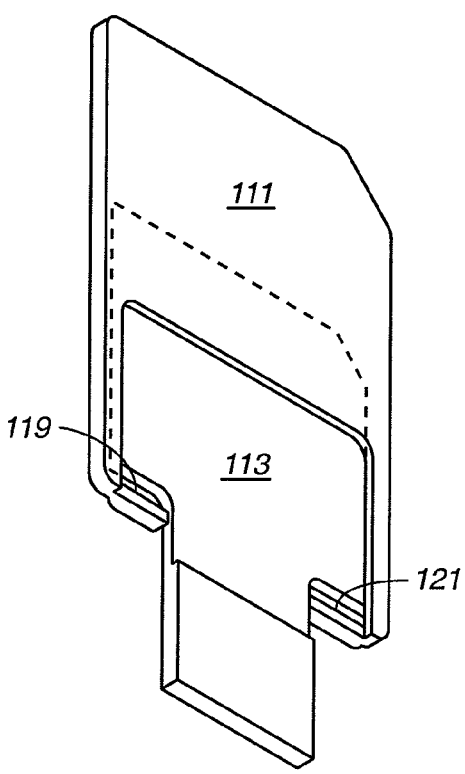
FIG._12D

MEMORY CARDS HAVING TWO STANDARD SETS OF CONTACTS

CROSS-REFERENCE TO RELATED APPLICATIONS

This application is a continuation of application Ser. No. 10/826,801, filed on Apr. 16, 2004. now U.S. Pat. No 7,152,801 This application is related to a non-provisional patent application entitled "Memory Card With Two Standard Sets of Contacts and a Hinged Contact Covering Mechanism," filed Apr. 16, 2004, application Ser. No. 10/826,796, by Robert C. Miller et al., which applications are incorporated herein in their entirety by this reference.

FIELD OF THE INVENTION

This invention relates generally to the use and structure of removable electronic circuit cards having different mechanical and/or electrical interfaces, particularly those including mass re-programmable non-volatile integrated circuit memory.

BACKGROUND OF THE INVENTION

Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls operation of the memory cell array and interfaces with a host to which the card connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard.

One such standard, the PC Card Standard, provides specifications for three types of PC Cards. Originally released in 1990, the PC Card Standard now contemplates three forms of a rectangular card measuring 85.6 mm. by 54.0 mm., having thicknesses of 3.3 mm. (Type I), 5.0 mm. (Type II) and 10.5 mm. (Type III). An electrical connector, which engages pins of a slot in which the card is removably inserted, is provided along a narrow edge of the card. PC Card slots are included in current notebook personal computers, as well as in other host equipment, particularly portable devices. The PC Card Standard is a product of the Personal Computer Memory Card International Association (PCMCIA). The current PC Card specifications, "PC Card Standard Release 8.0," dated April 2001, is available from the PCMCIA.

In 1994, SanDisk Corporation, assignee of the present application, introduced the CompactFlash™ card (CF™ card) that is functionally compatible with the PC Card but is much smaller. The CF™ card is rectangularly shaped with dimensions of 42.8 mm. by 36.4 mm. and a thickness of 3.3 mm., and has a female pin connector along one edge. The CF™ card is widely used with cameras for the storage of still video data. A passive adapter card is available, in which the CF card fits, that then can be inserted into a PC Card slot of a host computer or other device. The controller within the CF card operates with the card's flash memory to provide an ATA interface at its connector. That is, a host with which a CF card is connected interfaces with the card as if it is a disk drive. Specifications for the CompactFlash card have been established by the CompactFlash Association, "CF+ and CompactFlash Specification Revision 2.0," dated May 2003. An implementation of these specifications is described by SanDisk Corporation in a product manual "CompactFlash Memory Card Product Manual," revision 10.1, dated September 2003.

The SmartMedia™ card is about one-third the size of a PC Card, having dimensions of 45.0 mm. by 37.0 mm. and is very thin at only 0.76 mm. thick. Contacts are provided in a defined pattern as areas on a surface of the card. Its specifications have been defined by the Solid State Floppy Disk Card (SSFDC) Forum, which began in 1996. It contains flash memory, particularly of the NAND type. The SmartMedia™ card is intended for use with portable electronic devices, particularly cameras and audio devices, for storing large amounts of data. A memory controller is included either in the host device or in an adapter card in another format such as one according to the PC Card standard. Physical and electrical specifications for the SmartMedia™ card have been issued by the SSFDC Forum.

Another non-volatile memory card is the MultiMediaCard (MMC™). The physical and electrical specifications for the MMC™ are given in "The MultiMediaCard System Specification" that is updated and published from time-to-time by the MultiMediaCard Association (MMCA), including version 3.1, dated June 2001. MMC products having varying storage capacity are currently available from SanDisk Corporation. The MMC card is rectangularly shaped with a size similar to that of a postage stamp. The card's dimensions are 32.0 mm. by 24.0 mm. and 1.4 mm. thick, with a row of electrical contacts on a surface of the card along a narrow edge that also contains a cut-off corner. These products are described in a "MultiMediaCard Product Manual," Revision 5.2, dated March 2003, published by SanDisk Corporation. Certain aspects of the electrical operation of the MMC products are also described in U.S. Pat. No. 6,279,114 and in patent application Ser. No. 09/186,064, filed Nov. 4, 1998, now U.S. Pat. No. 6,901,457, both by applicants Thomas N. Toombs and Micky Holtzman, and assigned to SanDisk Corporation. The physical card structure and a method of manufacturing it are described in U.S. Pat. No. 6,040,622, assigned to SanDisk Corporation.

A modified version of the MMC™ card is the later Secure Digital (SD) card. The SD Card has the same rectangular size as the MMC™ card but with an increased thickness (2.1 mm.) in order to accommodate an additional memory chip when that is desired. A primary difference between these two cards is the inclusion in the SD card of security features for its use to store proprietary data such as that of music. Another difference between them is that the SD Card includes additional data contacts in order to enable faster data transfer between the card and a host. The other contacts of the SD Card are the same as those of the MMC™ card in order that sockets designed to accept the SD Card can also be made to accept the MMC™ card. A total of nine contacts are positioned along a short edge of the card that contains a cutoff corner. This is described in patent application Ser. No. 09/641,023, filed by Cedar et al. on Aug. 17, 2000, International Publication Number WO 02/15020, now U.S. Pat. No. 6,820,148. The electrical interface with the SD card is further made to be, for the most part, backward compatible with the MMC™ card, in order that few changes to the operation of the host need be made in order to accommodate both types of cards. Complete specifications for the SD card are available to member companies from the SD Association (SDA). A public document describing the physical and some electrical characteristics of the SD Card is available from the SDA: "Simplified Version of: Part 1 Physical Layer Specification Version 1.01," dated Apr. 15, 2001.

More recently, a miniSD card has been specified by the SDA and is commercially available. This card is smaller than the SD card but provides much of the same functionality. It has a modified rectangular shape with dimensions of 21.5 mm. long, 20.0 mm. wide and 1.4 mm. thick. A total of eleven electrical contacts are positioned in a row on a surface of the card along one edge. The miniSD memory card is available from SanDisk Corporation and described in the "SanDisk miniSD Card Product Manual," version 1.0, April 2003.

Another type of memory card is the Subscriber Identity Module (SIM), the specifications of which are published by the European Telecommunications Standards Institute (ETSI). A portion of these specifications appear as GSM 11.11, a recent version being technical specification ETSI TS 100 977 V8.3.0 (2000-08), entitled "Digital Cellular Telecommunications System (Phase 2+); Specification of the Subscriber Identity Module—Mobile Equipment (SIM—ME) Interface," (GSM 11.11 Version 8.3.0 Release 1999). Two types of SIM cards are specified: ID-1 SIM and Plug-in SIM.

The ID-1 SIM card has a format and layout according to the ISO/IEC 7810 and 7816 standards of the International Organization for Standardizaton (ISO) and the International Electrotechnical Commission (IEC). The ISO/IEC 7810 standard is entitled "Identification cards—Physical characteristics," second edition, August 1995. The ISO/IEC 7816 standard has the general title of "Identification cards—Integrated Circuit(s) Cards with Contacts," and consists of parts 1-10 that carry individual dates from 1994 through 2000. Copies of these standards are available from the ISO/IEC in Geneva, Switzerland. The ID-1 SIM card is generally the size of a credit card, having dimensions of 85.60 mm. by 53.98 mm., with rounder corners, and a thickness of 0.76 mm. Such a card may have only memory or may also include a microprocessor, the latter often being referred to as a "Smart Card." One application of a Smart Card is as a debit card where an initial credit balance is decreased every time it is used to purchase a product or a service.

The Plug-in SIM is a very small card, smaller than the MMC™ and SD cards. The GSM 11.11 specification referenced above calls for this card to be a rectangle 25 mm. by 15 mm., with one corner cut off for orientation, and with the same thickness as the ID-1 SIM card. A primary use of the Plug-in SIM card is in mobile telephones and other devices for security against the theft and/or unauthorized use of the devices, in which case the card stores a security code personal to the device's owner or user. In both types of SIM cards, eight electrical contacts (but with as few as five being used) are specified in the ISO/IEC 7816 standard to be arranged on a surface of the card for contact by a host receptacle.

Sony Corporation has developed and commercialized a non-volatile memory card, sold as the Memory Stick™, that has yet another set of specifications. Its shape is that of an elongated rectangle having 10 electrical contacts in a row and individually recessed into a surface adjacent one of its short sides that also contains a cut out corner for orientation. The card's size is 50.0 mm. long by 21.5 mm. wide by 2.8 mm. thick.

A more recent Memory Stick Duo card is smaller, having dimensions of 31.0 mm. long by 20.0 mm. wide by 1.6 mm. thick. Ten contacts are provided in a common recess in a surface and along a short side of the card, which also contains an orienting notch. This smaller card is often used by insertion into a passive adapter having the shape of a Memory Stick card.

SanDisk Corporation has introduced an even smaller transportable non-volatile TransFlash memory module in a modified rectangular shape, having dimensions of 15.0 mm. long by 11.0 mm. wide by 1.0 mm. thick. Eight electrical contact pads are provided in a row on a surface adjacent a short edge of the card. This card is useful for a variety of applications, particularly with portable devices, and is being incorporated into multimedia camera cell telephones.

As is apparent from the foregoing summary of the primary electronic card standards, there are many differences in their physical characteristics including size and shape, in the number, arrangement and structure of electrical contacts and in the electrical interface with a host system through those contacts when the card is connected with a host. Electronic devices that use electronic cards are usually made to work with only one type of card. Adaptors, both active and passive types, have been provided or proposed to allow some degree of interchangeability of electronic cards among such host devices. U.S. Pat. No. 6,266,724 of Harari et al. describes use of combinations of mother and daughter memory cards.

Small, hand-held re-programmable non-volatile memories have also been made to interface with a computer or other type of host through a Universal Serial Bus (USB) connector. These are especially convenient for users who have one or more USB connectors available on the front of their personal computers, particularly if a receptacle slot for one of the above identified memory cards is not present. Such devices are also very useful for transferring data between various host systems that have USB receptacles, including portable devices. Mechanical and electrical details of the USB interface are provided by the "Universal Serial Bus Specification," revision 2.0, dated Apr. 27, 2000. There are several USB flash drive products commercially available from SanDisk Corporation under its trademark Cruzer. USB flash drives are typically larger and shaped differently than the memory cards described above.

Another, higher transfer rate interface that has become commonplace on personal computers and other host devices is specified by the following standard of the Institute of Electrical and Electronics Engineers (IEEE): "IEEE Standard for a High Performance Serial Bus," document no. IEEE 1394-1995, as amended by document nos. IEEE 1394a-2000 and IEEE 1394b-2002. A common commercial form of this bus interface is known as FireWire. Because of its higher speed, this interface is particularly useful for the transfer of large amounts of data to and from a computing device.

SUMMARY OF THE INVENTION

In order to provide a portable non-volatile memory that is connectable directly with various types of host devices that include receptacles having various physical and electronic signal protocol and format characteristics, two or more external sets of electrical contacts are provided on a memory card system that conform to different recognized mechanical and electrical standards and specifications. The internal memory of the card system, most commonly flash memory, is operable through any of the sets of contacts alone with the appropriate signal protocol. The standards that are implemented are preferably those that will allow the system to be used directly with a wide variety of host devices. Two sets of such contacts are most conveniently provided in a single card system.

The example memory card systems described herein utilize one set of contacts and a signal protocol from one published memory card standard, such as that for the SD card, and the other set of contacts and a signal protocol according another published standard, such as the USB standard or another that provide similar opportunities for use, such as the IEEE 1394 standard. Many types of hosts include receptacle slots for SD cards, particularly cell phones, PDAs, MP-3 players, cameras and the like, while USB receptacles are common in personal computers, notebook computers and the like. Such a combination of interfaces thereby allows the memory card system to be used directly with a wider variety of host devices than either one alone.

One form of the memory card system is a standard unitary memory card with a second set of contacts added, either with or without an extension of the card. Another provides a sleeve in the shape of a standard memory card with an internal portion being extendable by hand to expose the second set of contacts. Yet another in the shape of a standard memory card allows a portion of its cover to be moved by hand to expose the second set of contacts for use. A further specific memory card system uses an outer sleeve that is slid by hand between extreme positions to expose one of two sets of contacts while covering the other. Another form of the memory card system includes a shell in the shape of one standard memory card with an internal memory card unit containing the second set of contacts and being insertable into the shell to enable the standard memory card function.

Additional aspects, advantages, features and details of the various aspects of the present invention are included in the following description of exemplary examples thereof, which description should be taken in conjunction with the accompanying drawings. All patents, patent applications, articles, manuals, standards, specifications and other publications referenced herein are hereby incorporated herein by this reference in their entirety for all purposes.

BRIEF DESCRIPTION OF THE DRAWINGS

FIGS. 1A and 1B show front and side views, respectively, of a first embodiment of a memory card having two sets of electrical contacts that conform with different industry specifications;

FIG. 2 is an electronic block diagram of the memory system within the card of FIGS. 1A and 1B;

FIG. 3 illustrates use of the card of FIGS. 1A, 1B and 2 with different types of electronic equipment;

FIGS. 4A and 4B show front and side views, respectively, of a second embodiment of a memory card having two sets of electrical contacts that conform with different industry specifications;

FIGS. 5A-5C show a third memory card embodiment utilizing a memory card insert and a surrounding sleeve, FIG. 5A showing the memory card outside of the sleeve, FIG. 5B showing the memory card positioned within the sleeve and FIG. 5C showing a side view of the card and sleeve of FIG. 5B;

FIGS. 6A-6C show a fourth memory card embodiment utilizing a memory card insert and a surrounding sleeve, FIG. 6A showing the memory card outside of the sleeve, FIG. 6B showing the memory card positioned within the sleeve and FIG. 6C showing a side view of the card and sleeve of FIG. 6B;

FIG. 7 illustrates, in a fifth embodiment, a variation of the memory card and sleeve of the fourth embodiment of FIGS. 6A-6C;

FIG. 8 shows an alternate structure for a portion of the foregoing memory card embodiments;

FIG. 9A shows a sixth memory card embodiment with one form of sleeve in place on the card in a protective position, and FIGS. 9B-9E illustrate four alternate versions of the sleeve of FIG. 9A when moved out of its protective position;

FIGS. 10A and 10B show a seventh memory card embodiment wherein a memory card is moveable between two positions with respect to a sleeve in which it is captured, the sleeve containing one set of contacts and the card insert the other, the two positions being shown in FIGS. 10A and 10B;

FIGS. 11A and 11B show an eighth memory card embodiment wherein a memory card is moveable between two positions with respect to a sleeve in which it is captured in order to expose one or the other of two sets of contacts on the card insert; and FIGS. 12A-12B illustrate a specific structure for implementing the eighth memory card embodiment shown generally in FIGS. 11A and 11B, FIGS. 12A and 12B showing respective front and rear views of the structure when the card is fully inserted into the sleeve and FIGS. 12C and 12D showing respective front and rear views of the structure when the card extends out of the sleeve.

DESCRIPTION OF EXEMPLARY EMBODIMENTS

Referring to FIG. 1A, a standard memory card 11, in this case the SD card, has an extension 13 formed as part of the card to provide an additional interface, in this case a USB compatible plug. According to the SD Memory Card Specifications, nine electrical contacts 15-23 are provided on bottom surfaces of grooves 25-32, the two contacts 22 and 23 being placed in the one groove 32. The card is 24 mm. by 32 mm. in size with a thickness 35 of 2.1 mm. (see the side view of FIG. 1B).

In order to be compatible with the USB specifications, the addition 13 has a minimum length of 12 mm. from an end 12 of the SD card portion and has a width of 12.35 mm. Four electrical contacts 37-40 according to the USB specifications are provided on the flat surface of the extension 13. Both sets of contacts 15-23 and 37-40 are positioned on the same side of the memory system card of FIG. 1A. The extension 13 has a thickness 43 of 1.70 mm. in the region of the contacts 37-40, which is less than that of the SD card portion 11. The thickness of the extension 13 is maintained within the extremities of the SD card portion, for a distance of at least 2 mm. from the edge 12 in a region 45 (FIG. 1A), so that it does not interfere with insertion of the structure into SD card slots that have a push-push connector, which requires pushing the card further into the slot than normal in order to release it for removal. The surrounding shield of the flat extension 13 that is part of the USB specification has been omitted.

Various of these details of the structure of FIGS. 1A and 1B can certainly be changed so long as the contact structure at one end physically conforms to one standard and the contact structure at the other end physically conforms to a second standard. One is a memory card standard since numerous hand held devices include receptacles for such cards. A memory card standard other than for the SD card, such as one of the others described above, can be utilized instead. The second standard is one that is more commonly used on personal computers, notebook computers and other computing devices, in this case the USB standard. The IEEE 1394 standard could instead be used for the second standard, for example, but its use is currently not as widespread as the USB. Alternatively, both sets of contacts may conform to different memory card standards. A third or more sets of contacts according to yet one or more other standards could also be added but it may usually not be practical to do so with such a small card system. And when a memory card includes a set of SD memory card contacts, as does the card of FIGS. 1A-B, the card can also be accessed by a host through these contacts as a MMC card because of the relationship between the SD and MMC card specifications. This memory within this card is therefore accessible through either of two physical sets of external electrical contacts with any one of three signal formats.

The electronic block diagram of FIG. 2 shows generally an example of the electronic system within the structure of FIGS. 1A and 1B. Flash memory 47 is accessed from the SD card contacts 15-23 through a controller circuit 49, as currently exists in SD memory cards. What is added is an interface circuit 51 for converting the SD signal protocols at the SD contacts 15-23 into USB signal protocols at the USB contacts 37-40. Alternatively, a single controller can be used in place of the circuits 49 and 51 to provide both signal protocols. If one or more additional sets of contacts are provided, provision is made to interface the additional set(s) of contacts with the signal protocols of the additional standard(s).

Because of the two interfaces, the resulting memory system of FIGS. 1A, 1B and 2 is useable with a wide variety of types of host devices. This is illustrated in FIG. 3. One set of contacts of such a memory card 53 can be inserted into a memory card slot of a PDA 55, and the other set of contacts into a USB receptacle of a notebook computer 57. Addition of the second interface increases the convenience and portability of the memory card. This is an advantage for most all uses of memory cards but is of particular benefit in certain applications. For example, if the card 53 stores the medical history and other health information of an individual who is carrying the card at the time of an accident or sudden illness, it is more likely that emergency health care providers will have access to a host device that can immediately read the stored information from the card through either of the two interfaces. The two interfaces also increase the usefulness of a memory card for transferring data between different types of hosts. For example, data can be transferred by the card 53 of FIG. 3 between the PDA 55 and the computer 57, even though these hosts do not have a common card interface.

The second pattern of contacts can be added to most any standard memory card. Another example is given in FIGS. 4A and 4B, respective front and side views of a miniSD card 14 with the USB connector portion 13 added. The miniSD card has eleven electrical contacts 46 mounted along one edge on a surface portion that is slightly depressed from the front card surface. Only nine of these contacts are currently used, the same number and with the same functions as the SD memory card. A thickness 42 specified for the miniSD card is 1.4 mm., smaller than the 1.70 mm. thickness 43 of the USB plug extension.

A variation of the structure of the card described with respect to FIGS. 1A-3, but with the same functionality and advantages, is illustrated in FIGS. 5A-5C. Instead of a single unitary card structure, a unitary card 61 is inserted into a sleeve 63. Elements that are the same or functionally the same as those of the earlier figures are given the same reference numbers. The memory card 61 includes both the memory card contacts 15-23 and the USB contacts 37-40 on a common planar surface of a unitary piece, such as results from injection molding. In plan view, the card 61 has the same dimensions as the card of FIG. 1A except that its wider portion is made to be somewhat narrower than the portion of the card of FIG. 1A so that it can be inserted into the sleeve 63 that has outer dimensions conforming to the SD card standard. The card 61 is shown to be so inserted into the sleeve 63 in FIG. 5B. The sleeve 63 includes the openings 25-32 at an otherwise closed end through which the contacts 15-23 are accessible when the card 61 is inserted into the sleeve 63, as shown in FIG. 5B. The sleeve 63 also contains an opening at its end opposite the openings 25-32, through which the card 61 is inserted and removed. When the card 61, which contains the memory and interface circuits of FIG. 2, is to be inserted into a SD memory card receptacle, it is first inserted into the sleeve 63, as shown in FIG. 5B. The end of the combination containing the contacts 15-23 is inserted into the SD memory card slot. When the card 61 is to be inserted into a USB receptacle, this can be done with or without the sleeve 63 in place.

The thicknesses of the card 61 and the sleeve 63 relative to each other are shown in the side view of FIG. 5C. An outside thickness 65 of the sleeve 63 conforms to the memory card specifications, in this case that of the SD card, namely 2.1 mm. In order to fit within the sleeve 63, at least the portion of the card 61 that fits within the sleeve, most of the card, is made to have a thickness 67 that is about equal to or less than the inside dimension of the sleeve. The card 61 is then easily inserted into the sleeve 63 and removed from it by hand. A thickness that provides a somewhat tight fit between the two holds them together so that they do not easily separate. Alternatively, a push-push connector (not shown) may be included in the sleeve to positively hold them together but releasing the card in response to the card being pushed a distance into the sleeve. As a further alternative, a detent mechanism (not shown), such as small indentations on opposite sides of the memory card 61 and cooperatively shaped and positioned bumps on the inside of the sidewalls of the sleeve 63, can alternatively be employed. The detent is engaged and disengaged by sufficient hand force when inserting the card 61 into, or removing it from, the sleeve 63. With use of a push-push, detent or other positive holding mechanism, the memory card thickness 67 can be made as small as the memory card technology allows, such as 1 mm., since the relative thicknesses of the card 61 and sleeve 63 need not be controlled to hold the two together. Front and rear walls of the sleeve 63 are preferably planar, except for the area including the openings 25-32. Similarly, the card 61 preferably has parallel planar front and rear surfaces except for the region of the second set of contacts 37-40, where the thickness is made to conform to the specifications for those contacts. In the case of a USB connector, the dimensions of the extension containing the contacts 37-40 are as described for the extension 13 of FIGS. 1A and 1B, the thickness 69 being 1.70 mm.

A card having a contact pattern other than that of the SD card may alternately be used with a separate sleeve, following that of FIGS. 5A-C. The Memory Stick memory card is particularly adaptable to separation into an inner card and outer sleeve since it, as does the SD card, utilizes slots along a narrow edge in which the exposed electrical contacts are recessed. For other memory cards that do not have their contacts recessed, the sleeve is added with, of course, openings through one wall over the contacts of the inner card when fully inserted.

A modification of the memory system of FIGS. 5A, 5B and 5C is illustrated in respective FIGS. 6A, 6B and 6C. Instead of the memory card containing the contacts that become accessible though openings in the sleeve when the card is inserted into it, a cooperatively shaped sleeve 71 and card 73 have sets 75-83 and 85-93 of contacts, respectively, that make electrical contact when the card is inserted into the sleeve. The memory card contacts 15-23 are attached to the sleeve 71. A small printed circuit board is positioned within the sleeve, attached to an inner side of its top surface, that contains contacts 75-83 facing downward into the sleeve and including conductive traces (shown as dashed lines) connecting each of these contacts with a respective one of the memory card contacts 15-23. When the card 73, which is shorter than the card 61 of FIG. 5A, is inserted into the sleeve 71, the card contacts 85-93 make physical contact with respective ones of the sleeve contacts 75-83. The positioning of these contacts need not follow any particular card standard.

FIG. 7 shows a variation of the embodiment of FIGS. 6A-C. Instead of the inserted card 73 configured as shown in FIGS. 6A-C, the card of FIGS. 4A-B is used as the insert. A sleeve 71* is similar to the sleeve 71, the primary difference being that the internal contacts for contacting an inserted card are positioned in the pattern of the miniSD card contacts 46. When the memory card is inserted into the sleeve 71*, each of the nine active miniSD card contacts 46 is electrically connected within the sleeve 71* with an appropriate one of the SD card contacts 15-23. As with the card 73, the card insert of FIG. 7 is removable from the sleeve 73*.

Although the examples of FIGS. 6A-C and 7 utilize a shell and its contacts that conform to the SD memory card specifications, they could follow another of the memory card standards instead. Use of the Memory Stick or miniSD standards are among the possibilities.

A possible modification to the USB connector portion of the embodiments of FIGS. 1A-B, 4A-B, 5A-C, 6A-C and 7 is illustrated in FIG. 8. Rather than just providing a connector with a planar shape, one or both rails 97 and 99 are added as a key to prevent the plug from being inserted into a USB receptacle up side down and thus fail to make electrical contact. When properly inserted, the rails 97 and 99 fit on opposite sides of a substrate in the USB receptacle that carries the contacts. If inverted, the plug of FIG. 8 will not fit into the USB receptacle. Since the rails 97 and 99 are normally too thick to fit into the usual memory card receptacle slot, they are positioned a distance 101 (such as 2.0 mm. or more) from an edge of the memory card to which the plug is attached so that they do not limit pushing the card further into the memory card slot to release it from a push-push connector.

FIGS. 9A-9E illustrate several variations of another embodiment of the memory card system. Rather than extending the dimensions of a standard memory card to accommodate the second connector, the entire structure is maintained within the footprint of the standard memory card. FIG. 9A shows the combination within the outer 24 mm. by 32 mm. dimensions of the SD card, as an example. A cap 103, which is removable and re-attachable by a hand operated frictional fit, protects the USB contacts 37-40 when the unit is being used as a SD memory card. The cap 103 may be closed at its exposed end but is open at the end into which the USB connector plug is inserted. The view FIG. 9B shows the structure with this cap removed. In the configuration of FIG. 9A, the unit appears and is used like any standard SD memory card. When the cap 103 is removed (FIG. 9B), the unit may be inserted into a USB receptacle. The amount of space devoted to the memory and other integrated circuits is, of course, reduced since the USB connector occupies a portion of the length of the standard SD card instead. Otherwise, the structure is as described with respect to FIGS. 1A-B. Or the memory card may be a separate piece that fits within a sleeve, according to the embodiment of FIGS. 5A-C. The separate memory card and sleeve may, as a further alternative, contain mating electrical contacts in the manner of the embodiment of FIGS. 6A-C.

Since the removable cap 103 could become lost in use, it is preferable to retain an attachment between it and at least the outer shell or sleeve of the unit when the USB connector is being used. FIG. 9C illustrates one way to do this with a slideable cover 103'. The exposed end of the cap 103 (FIG. 9A) is opened to form the cover 103' that is slid by hand between the position shown in FIG. 9C, wherein the USB connector is exposed for use, and a second position where the cover 103' overlies the USB contacts 37-40, as is shown for the cap 103 in FIG. 9A.

Another manner of attachment is illustrated in FIG. 9D, where a cap 103" is attached by a hinge 105 to the main card body at its end from which the extension containing the contacts 37-40 extends. This allows the cap 103" to be swung out of the way when the card is to be inserted into a USB receptacle, the position shown in FIG. 9D. When pivoted 180 degrees about the hinge 105 by hand in a counterclockwise direction, the unit will appear as shown in FIG. 9A. The rotation occurs about an axis that is perpendicular to the broad surfaces of the card. In a variation on the structure of FIG. 9D, the cap is split into two portions that are separately pivoted about respective hinges 105 and 107, as illustrated in FIG. 9E.

Rather than having a portion of the outer shell or sleeve that is moved out of the way of the USB connector, as illustrated in FIGS. 9A-E, a shell with the shape of a standard memory card may have a memory card retained therein that is moveable by hand between two extreme positions with respect to the shell. In one position, the memory card is totally within the shell to enable the unit to be used as a memory card, and in the other position the card is slid along the shell to extend the USB connector out of the shell to enable insertion into a USB receptacle. Two alternate ways of accomplishing this are shown in FIGS. 10A-B and 11A-B.

The implementation of FIGS. 10A-B is like that described above with respect to FIGS. 6A-C, except that an internal card 73' is made shorter than the card 73 in order to fit entirely within a shell 71' in one position (FIG. 10A) and to be retained within the shell 71' by a mechanical stop at its end through which the second connector extends when the card is slid along the shell into the second position (FIG. 10B). This mechanical stop can be provided by restricting the size of the end opening in the shell to allow the second connector extension to pass through while being too small for the wider main portion of the memory card to pass. A portion of the backside of the shell 71' adjacent this end may optionally be removed (not shown) for a distance from the end in order to facilitate moving and/or holding of the card by hand. The card 73' can be prevented from moving back into the shell 71' from the position shown in FIG. 10B by use of an internal detent mechanism (not shown) that can be overridden by hand when the user desires to move the card 73' back into the shell 71'. The SD memory card and USB specifications are also implemented in this example but, as with the other examples, is not limited to this particular combination.

Similarly, the memory card system of FIGS. 11A-B is like that described with respect to FIGS. 5A-C, except that an internal card 61' is made shorter than the card 61 in order to fit entirely within a shell 63' in one position (FIG. 11A) and to be retained within the shell 63' by a mechanical stop at its end through which the second connector extends when the card is slid along the shell into the second position (FIG. 11B). The shell 63', in this example, also has outer dimensions according to the SD memory card standard and the second set of contacts shown on the card follow the USB standard. Appropriate mechanical techniques may be used to retain the card 61' in the two extreme positions of FIGS. 11A and 11B but allow this retention to be overcome by hand to slide the shell 63' with respect to the card 61'.

In the two examples of FIGS. 10A-B and 11A-B, the shell is slid with respect to the internal memory card to expose one of the sets of contacts while covering and protecting the other. As with the other embodiments described herein, a single side of the internal memory card carries the two sets of external electrical contacts for convenience but the two sets could be positioned on opposite sides of the card if there was a reason to do so.

FIGS. 12A-D show perspective views of a more detailed implementation of the embodiment of FIGS. 11A-B. A shell 111 having an external shape and other physical characteristics of a memory card according to the SD card standard has a memory card 113 contained within it. In FIGS. 12A-B, the card 113 is shown fully inserted into the shell. A lip 115 at the end of a resilient wall portion 117 holds the card 113 in place. Contacts 15-23 on the card 113 are, in this position, accessible through openings 25-32 of the shell 111. The signals at the contacts 15-23 are according to the SD memory card specifications. The unit can be inserted into a SD memory card receptacle of a host or other device that may be connected to a host, the end containing the contacts 15-23 being inserted first.

In FIGS. 12C-D, the memory card 113 has been withdrawn from the shell 111 to expose the USB connector plug and its contacts 37-40. At the same time, the other set of contacts 15-23 has been withdrawn into the sleeve and are thereby covered by it. The card 113 is released from the shell 111 by flexing the resilient wall portion 117 by hand away from the card to remove the lip 115 from its path. When removed, the card 113 is prevented from being separated from the shell 111 by tabs 119 and 121 on the end of the shell. Removal of the relatively narrow USB connector plug from the shell 111 is stopped when the wider portion of the card 113 abuts the shell tabs 119 and 121, as best seen from FIG. 12D. A portion of the backside of the shell 111 adjacent this end may be removed, as shown, in order to facilitate manipulation of the card 113 by hand. An internal detent mechanism (not shown) can be used to prevent the card 113 from inadvertently moving back into the shell 111. The user overcomes this retention when pushing the card 113 back into the shell 111. Alternatively, the card 113 can be held by hand in its extended position by the user gripping it through the backside opening of the shell 111 when inserting the extended USB plug into a USB receptacle.

Although the examples of FIGS. 11A-B and 12A-C utilize a shell and its contacts that conform to the SD memory card specifications, they could follow another of the memory card standards instead. Use of the Memory Stick or miniSD standards are among the possibilities. And although these examples show that the second set of contacts follows the USB specifications, another standard memory card or other data transfer interface could be used instead.

Although the various aspects of the present invention have been described with respect to several exemplary embodiments and variations thereof, it will be understood that the invention is entitled to protection within the full scope of the appended claims.

The invention claimed is:

1. A memory card system, comprising:
   an enclosed electronic circuit card having first and second sets of electrical contacts with different contact patterns positioned on an outside surface of the card a distance apart from each other such that they mate with a respective one of first and second mating receptacles but not the other,
   a re-programmable non-volatile memory system within the card and operably connected to transfer data between the memory and outside of the card with different signal protocols through either of the first or second sets of contacts without use of the other, and
   a cover carried by the card and slideable therealong by hand between at least first and second positions with respect to the card, the first set of contacts being covered when the cover is in the first position and exposed for insertion into the first mating receptacle when the cover is in the second position, wherein the relative sizes and shapes of the card and cover are such that the card fits totally within the cover when the cover is in the first position,
   wherein the cover includes a plurality of openings shaped and positioned to expose the second set of contacts on the circuit card when the cover is in the first position.

2. The memory card system of claim 1, wherein the first set of contacts has a contact pattern and signal protocol therethrough that follows a USB standard.

3. The memory card system of claim 2, wherein the second set of contacts has a contact pattern and signal protocol therethrough that follows a memory card standard.

4. The memory card system of claim 3, wherein the memory card standard is a SD card standard.

5. The memory card system of claim 1, wherein the second set of contacts is covered when the cover is in the second position.

6. A memory card system, comprising:
   an enclosed electronic circuit card having first and second sets of electrical contacts with different contact patterns positioned apart from each other such that they mate with a respective one of first and second mating receptacles but not the other, at least the first set of contacts being carried by an outside surface of the card,
   a re-programmable non-volatile memory system within the card and operably connected to transfer data between the memory and outside of the card with different signal protocols through either of the first or second sets of contacts without use of the other, and
   a cover carried by the card and slideable therealong by hand between at least first and second positions with respect to the card, the first set of contacts being covered when the cover is in the first position and exposed for insertion into the first mating receptacle when the cover is in the second position, wherein the relative sizes and shapes of the card and cover are such that the card fits totally within the cover when the cover is in the first position, the cover additionally comprising:

a third set of contacts on an inside of the cover that are arranged to mate with the second set of contacts of the card when the cover is in the first position, and a fourth set of contacts on an outside of the cover, the third and fourth sets of contacts being electrically connected with each other, wherein the fourth set of contacts includes a pattern of contacts that mate with the second receptacle.

7. A memory card system, comprising:

an enclosed electronic circuit card having first and second sets of electrical contacts with different contact patterns positioned apart from each other such that they mate with a respective one of first and second mating receptacles but not the other, at least the first set of contacts being carried by an outside surface of the card, a re-programmable non-volatile memory system within the card and operably connected to transfer data between the memory and outside of the card with different signal protocols through either of the first or second sets of contacts without use of the other, and a cover carried by the card and slideable therealong by hand between at least first and second positions with respect to the card, the first set of contacts being covered when the cover is in the first position and exposed for insertion into the first mating receptacle when the cover is in the second position, wherein the relative sizes and shapes of the card and cover are such that the card fits totally within the cover when the cover is in the first position, the cover additionally comprising:

a third set of contacts on an inside of the cover that are arranged to mate with the second set of contacts of the card when the cover is in the first position, and a fourth set of contacts on an outside of the cover, the third and fourth sets of contacts being electrically connected with each other, wherein the fourth set of contacts includes a pattern of contacts that mate with a third mating receptacle but not with either of the first or second mating receptacles.

8. A memory card system, comprising:

an enclosed electronic circuit card having first and second sets of electrical contacts on an outside surface of the card with different contact patterns spaced apart from each other, the first set of contacts being in accordance with a first published card standard, a re-programmable non-volatile memory system within the card and operably connected to transfer data between the memory and outside of the card with different signal protocols according to respective first and a second published card standards through either of the first or second sets of contacts without use of the other, and a cover carried by the card and moveable by hand between at least first and second positions with respect to the card, the cover including a third set of contacts on an inside surface of the cover that mates with the second set of contacts on the card when the cover is in the first position and a fourth set of contacts on an outside surface of the cover with a contact pattern different from that of the first set of contacts on the card and in accordance with the second published card standard, the third and fourth sets of contacts on the cover being electrically connected together, the first set of contacts on the card being covered when the cover is in the first position and exposed when the cover is in the second position.

9. The memory card system of claim 8, wherein the relative sizes and shapes of the card and cover are such that the card fits totally within the cover when the cover is in the first position.

10. The memory card system of claim 8, wherein the mating second and third sets of contacts have the same pattern as the fourth set of contacts and follow the second published card standard.

11. The memory card system of claim 8, wherein the mating second and third sets of contacts have a pattern that is different from the pattern of the fourth set of contacts.

12. The memory card system of claim 8, wherein the first set of contacts has a contact pattern and signal protocol therethrough that follows a USB standard.

13. The memory card system of claim 12, wherein the fourth set of contacts has a contact pattern and signal protocol therethrough that follows a memory card standard.

14. A memory card system, comprising:

an enclosed electronic circuit card having first and second sets of electrical contacts with different contact patterns positioned apart from each other on an outside surface of the card, a re-programmable non-volatile memory system within the card and operably connected to transfer data between the memory and outside of the card with different signal protocols through either of the first or second sets of contacts without use of the other, and a cover carried by the card in a manner to be movable thereacross by hand along a path extending between the first and second sets of contacts, the cover being shaped and sized relative to the card to (1) cover the first set of contacts and expose the second set of contacts when in a first extreme position along the path, and (2) expose the first set of contacts and cover the second set of contacts when in a second extreme position along the path, the cover additionally comprising:

a plurality of openings shaped and positioned to expose the second set of contacts on the circuit card when the cover is in the first extreme position, and a solid surface without openings in a region that is positioned over the second set of contacts on the circuit card when the cover is in the second extreme position.

15. The memory card system of claim 14, wherein the pattern of the first set of electrical contacts follows a first published card standard and the pattern of the second set of electrical contacts follows a second published card standard.

16. The memory card system of claim 15, wherein the first published card standard follows a USB standard and the second published card standard follows a memory card standard.

* * * * *